United States Patent [19]

Lee et al.

[11] Patent Number: 4,908,796

[45] Date of Patent: Mar. 13, 1990

[54] REGISTERED OUTPUTS FOR A MEMORY DEVICE

[75] Inventors: Robert D. Lee, Denton; Hal Kurkowski; Michael L. Bolan, both of Dallas, Tex.

[73] Assignee: Dallas Semiconductor Corporation, Dallas, Tex.

[21] Appl. No.: 198,164

[22] Filed: May 24, 1988

[51] Int. Cl.$^4$ .............................................. G11C 7/00
[52] U.S. Cl. ................................ 365/189.05; 365/233; 307/475
[58] Field of Search ............... 365/189, 233, 205, 207, 365/208, 194; 307/475

[56] References Cited

U.S. PATENT DOCUMENTS

| | | | |
|---|---|---|---|
| 4,573,147 | 2/1986 | Aoyama et al. | 365/190 |
| 4,575,824 | 3/1986 | Tanaka et al. | 365/233 |
| 4,603,403 | 7/1986 | Toda | 365/190 |
| 4,680,491 | 7/1987 | Yokouchi et al. | 365/189 |
| 4,682,048 | 7/1987 | Ishimoto | 365/233 |
| 4,703,457 | 10/1987 | Bodenstab | 365/189 |

Primary Examiner—Glenn A. Gossage
Attorney, Agent, or Firm—Worsham, Forsythe, Sampels & Wooldridge

[57] ABSTRACT

Registered output circuitry for a memory device includes a first latch which stores data from a sense amplifier on the rising edge, and outputs it on the falling edge, of the falling edge of an $\overline{OE}$ signal. This data stored in the latch is provided as output of only y, during the preceding rising edge of the $\overline{OE}$ signal the $\overline{CE}$ signal to the memory device was a logical 0 level, and the $\overline{WE}$ signal was a logical 1 level. Since the falling edge of the $\overline{OE}$ signal is the beginning of the memory cycle, the data at the output pin of the memory is the data read in the previous read cycle. This latency, however, enables a shortened average cycle time, and also provides registered outputs without the necessity of an external clock signal applied to the memory device.

11 Claims, 2 Drawing Sheets

REGISTERED OUTPUTS FOR A MEMORY DEVICE

TECHNICAL FIELD

This invention relates to memory devices, and more particularly, to registered output circuits for memory devices.

BACKGROUND OF THE INVENTION

Registered outputs for memory devices as provided in the past utilize a data storage device between the output of the memory sense amplifier and the output driver stage of the memory. This storage device, commonly a latch circuit, requires a clock signal supplied to the memory device to load data from the sense amplifier into the latch.

However, certain standards have developed in the industry with respect to the number of pins in an integrated circuit package and the functions of each of these pins, and the requirement of an external clock signal necessitates a nonstandard package for the memory device. Moreover, additional pins require a larger package and more room on a printed circuit board for routing additional signals to the integrated circuit package.

Also relevant to the present invention is the access time of conventional memory devices. The access time specified by manufacturers is the time in which the output data at the output pin of the integrated circuit is transitioning to a logical 0 level or a logical 1 level. Therefore, the data is available to the user actually at a later time, the time required for the output signals from the memory to be stable long enough to enable the circuitry inside the device being driven by the memory to stabilize and reliably detect the output signal from the memory device. Moreover, the output of the sense amplifier inside the memory device is generally several nanoseconds faster than the time the output data is available at the output pin of the memory device due to the delay through the output driver circuit of the memory device and the capacitance associated with the output pin and circuitry being driven by the memory device. Stated another way, the data at the output of the sense amplifier of the memory device is available several nanoseconds before the data can be reliably transferred from the output pin of the memory device to the circuit receiving the data.

Therefore, it can be appreciated that registered output circuitry for a memory device which is able to store the output data from the memory device without necessitating an external clock signal and which is also able to decrease the average access time of the memory device by effectively eliminating the delays occurring after the data is present at the output of the sense amplifier is highly desirable.

SUMMARY OF THE INVENTION

It is, therefore, an object of this invention to provide register output circuitry for a memory device which permits the storage of output data of the memory device without requiring an external clock signal.

It is also an object of this invention to provide registered output circuitry for a memory device which enables the memory device to be operated in a manner to decrease the average access time of the memory device.

Shown in an illustrated embodiment of the invention is registered output circuitry for a memory device which includes a storage device for storing the output signal of a sense amplifier in the memory device upon the first transition of an output enable signal received at an input pin of the memory device and also includes circuitry for enabling an output driver circuit of the memory device upon a second transition of the output enable signal.

In a further aspect of the invention, the registered output circuitry also includes sensing circuitry for detecting if a chip enable signal applied to another input pin of the memory device is at a first logic state and enabling the output driver circuit only if the chip enable signal is at this first logic state.

Also shown in an illustrated embodiment of the invention is a method for providing data at an output terminal of a memory device by storing the output of a sense amplifier in a storage register upon a first transition of an output enable signal and by enabling an output driver circuit to provide the data stored in the storage register at an output pin of the memory device upon a second transition of the output enable signal.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
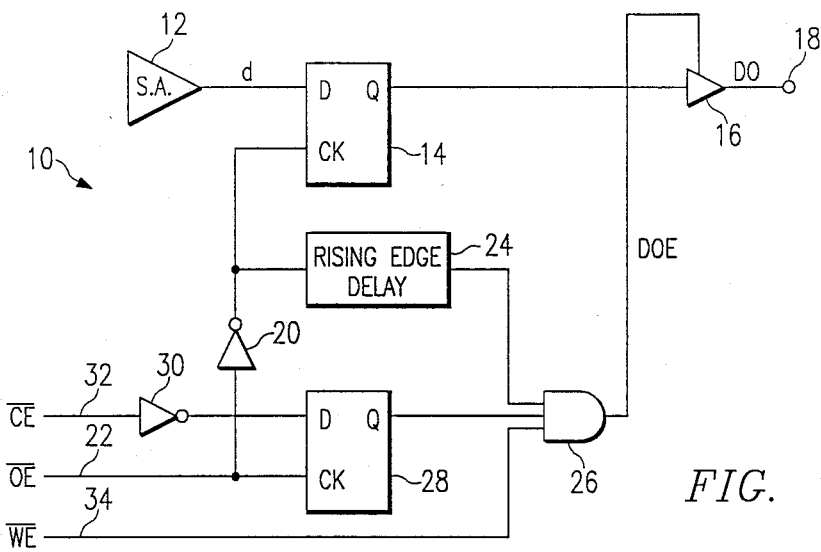
FIG. 1 is a logic diagram of the registered output circuitry according to the present invention.

It will be appreciated that for purposes of clarity and where deemed appropriate, reference numerals have been repeated in the figures to indicate corresponding features.

DESCRIPTION OF THE PREFERRED EMBODIMENT

The present invention provides registered outputs for a memory device without the necessity of an external clock signal. The registered output circuitry effectively eliminates the delay in the access time due to the switching delay through the output buffer circuit, and also effectively eliminates the delay in the cycle time caused by the delay required to hold the output data for a period sufficient to be clocked into circuitry driven by the output pin of the memory device.

The registered output circuitry of the preferred embodiment of the present invention utilizes a first D latch in which the data input is received from the output of the sense amplifier of the memory device, and the Q output of the D latch drives the input of a tristate output driver circuit, the output of which is connected to an output pin of the integrated circuit. The first D latch is clocked by the inverse of an externally applied output enable signal ($\overline{OE}$). A second D latch is clocked by the $\overline{OE}$ signal and has its D input connected to the inverse of the externally applied chip enable signal ($\overline{CE}$). The inverse of the $\overline{OE}$ signal is also connected to a rising edge delay circuit and the output of the rising edge delay circuit is ANDed with the Q output of the second D latch and the external write enable signal (WE). The output of this AND gate provides the tristate or enable signal to the output driver circuit.

For a read operation the falling edge of the $\overline{OE}$ signal begins the read cycle, and this falling edge (after being inverted) clocks the first D latch to capture and hold the output of the sense amplifier at that time. The data from the sense amplifier is then provided at the Q output of the first D latch which in turn is provided to the input of the output driver circuit. The rising edge delay circuit provides a delay sufficient to compensate for the delay through the first D latch, and after this short time period, the three inputs to the AND gate are all at a logic 1 level if the Q output of the second D latch is a logic 1 level. The Q output of the second D latch will be a logic 1 level if the $\overline{CE}$ signal is a logic 0 level during the previous cycle since the rising edge of the $\overline{OE}$ signal clocks the second D latch.

When all three of the inputs to the AND gate are at a logic 1 level, the output driver circuit is switched from a high impedance state to either a logic 1 level or a logic 0 level which is applied to the output pin. When the $\overline{OE}$ signal rises at the end of the memory cycle, this inverted signal passes through the rising edge delay circuit to cause the output of the AND gate to become a logic 0 level which forces the output driver circuit to the high impedance state at its output.

Since the data out of the sense amp is strobed into the first D latch at the start of the memory cycle, the data present at the output pin of the memory device during this memory cycle is the data which was read during the previous memory cycle. In other words, there is a one cycle latency between the time a memory cell is addressed and the time the data is actually available at the output pin of the memory device. However, this latency occurs only on read operations. A write operation is not affected by this registered output circuitry, and there is no latency between the cycle in which the data and address is selected and the cycle in which the writing actually occurs into the memory address.

Since the data from the previous memory cycle is captured and held in the first D latch, the time required for the data to progress through the first D latch and the output driver circuit can also be used by the memory device to start the next succeeding cycle of the memory. Thus, the read cycle time can be effectively shortened to the time required to provide data at the output of the sense amplifier; that is, the read cycle time does not require time for the data to progress to the output pin and for the data to be held long enough to be captured by circuitry being driven by the output pin of the memory device.

Advantageously, the registered output circuitry of the present invention allows a plurality of memory devices to be cascaded in which they share common $\overline{OE}$ and $\overline{WE}$ signals and have their output pins hardwired together. They may or may not share common address input lines. However, each of the cascaded memory devices has a separate $\overline{CE}$ input signal which is used to select which memory device is to be read or written into for each cycle of operation. Moreover, since the output driver stages provide a high impedance output whenever the $\overline{OE}$ signal is at a logic 1 level, there is always a high impedance state on all of the output pins of the cascaded memory devices between each cycle of operation of the memories. The external signals used by the registered output circuitry 10 (the $\overline{OE}$, $\overline{CE}$, and $\overline{WE}$ signals) are industry standard input signals to SRAM memory devices.

Turning now to the drawings, FIG. 1 is a schematic diagram of a registered output circuitry 10 according to the present invention. In the preferred embodiment shown in FIG. 1, a sense amplifier 12 in a static RAM memory device senses the data stored in the memory cell and provides a signal, d, at its output which is connected to the D input of a first D latch 14. The Q output of the D latch 14 is connected to the input of a tristate output driver circuit 16, the output of which forms a signal, DO, which is applied to an output pin 18 of the memory device. The clock input of the D latch 14 is connected to the output of an inverter 20, the input of which is connected to a line 22 which is driven by an external output enable signal $\overline{OE}$. The output of the inverter 20 is also connected to the input of a rising edge delay circuit 24, the output of which is connected to a first input of an AND gate 26. The $\overline{OE}$ signal on line 22 is also connected to the clock input of a second D latch 28. The D input of the D latch 28 is connected to the output of another inverter 30, the input of which is connected to a line 32 which is driven by an external chip enable signal $\overline{CE}$. The Q output of the D latch 28 is connected to a second input of the AND gate 26. A third input of the AND gate 26 is connected to a line 34 which is driven by an external write enable signal $\overline{WE}$. The output of the AND gate 26 forms a data out enable signal, DOE, which is connected to the output driver circuit 16.

Figure 2:
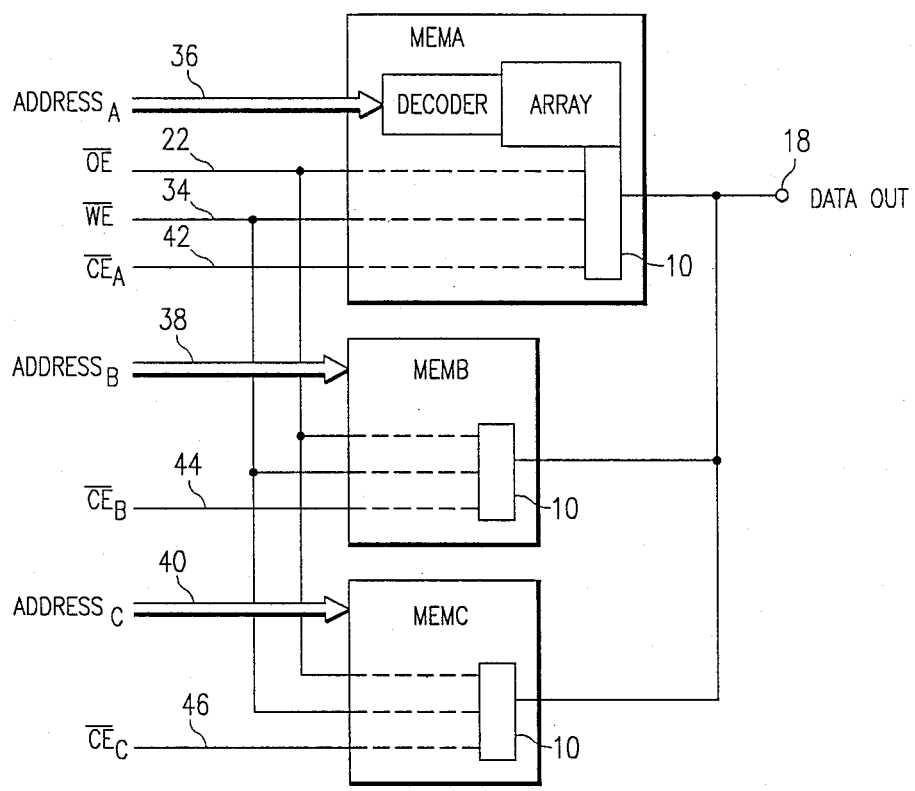
FIG. 2 is a block diagram of three memory devices which include registered output circuitry according to the present invention.

The registered output circuitry 10 of FIG. 1 can be used with cascaded memory devices as shown in FIG. 2. As shown in FIG. 2, three memory devices, MEMA, MEMB, and MEMC are cascaded in that they have a common output enable signal $\overline{OE}$, a common write enable signal $\overline{WE}$, and a common data out line. As shown in FIG. 2 each of the memory devices has separate address buses, MEMA having address bus 36, MEMB having address bus 38, and MEMC having address bus 40. Also, each of the memory devices has a separate chip enable signal, MEMA having a $\overline{CE}_A$ signal on line 42, MEMB having a $\overline{CE}_B$ signal on line 44, and MEMC having a $\overline{CE}_C$ signal on line 46.

The operation of the registered output circuitry 10 will now be described with reference to FIG. 3 and FIG. 4. In the preferred embodiment a memory cycle begins on the falling edge of the $\overline{OE}$ signal. This falling edge of the $\overline{OE}$ signal causes a rising edge out of the inverter 20 to clock the D latch 14. At this time the output of the sense amp 12 is latched into the D latch 14 and transferred to the Q output of the D latch 14 and thus to the input of the output driver circuit 16. This rising edge at the output of the inverter 20 is delayed by the rising edge delay circuit 24 by a time interval equal to the time required for the data to be transferred from the input of the D latch 14 to the input of the output driver circuit 16. This time delay is shown as element 48 in FIG. 3. This time delay is added to insure that the data output enable signal at the output of the AND gate 26 will not go high before the proper data is at the input of the output driver circuit 16.

If during the previous rising edge of the $\overline{OE}$ signal the $\overline{CE}$ signal on line 32 was a logic 0 level indicating that the particular memory device was to be selected, then a logic 1 level at the output of the inverter 30 would be stored in the D latch 28 and provided as a second input to the AND gate 26. If during the memory cycle started by the falling edge of the $\overline{OE}$ signal the $\overline{WE}$ signal is at a logic 1 level, then after the output of the rising edge delay circuit 24 becomes a logic 1 level, the output of the AND gate 26 will also become a logic 1 level which will enable the output driver circuit 16 to provide the data out on output terminal 18 of the memory device. If the write enable signal $\overline{WE}$ on line 34 is a logic 0 level or if the chip enable signal $\overline{CE}$ on line 32 was at a logic 1 level on the previous rising edge of $\overline{OE}$, then the output of the NAND gate 26 will remain at a logic 0 level and the output terminal 18 will remain at a high impedance state since the output driver circuit 16 will not have been enabled.

The output of the AND gate 26 will also be a logic 0 level any time that the $\overline{OE}$ signal on line 22 is a logic 1 level. It will be understood that the rising edge delay circuit 24 delays only the rising edge of the output of the inverter 20, but provides essentially no delay to a falling edge at the output of the inverter 20. Thus, when several memory devices are cascaded and have their output terminals 18 connected together, there will not be contention among the output driver circuits 16 since between each cycle, when the $\overline{OE}$ signal is at a logic 1 level, all of the output driver circuits 16 will be in their high impedance state.

Figure 3:
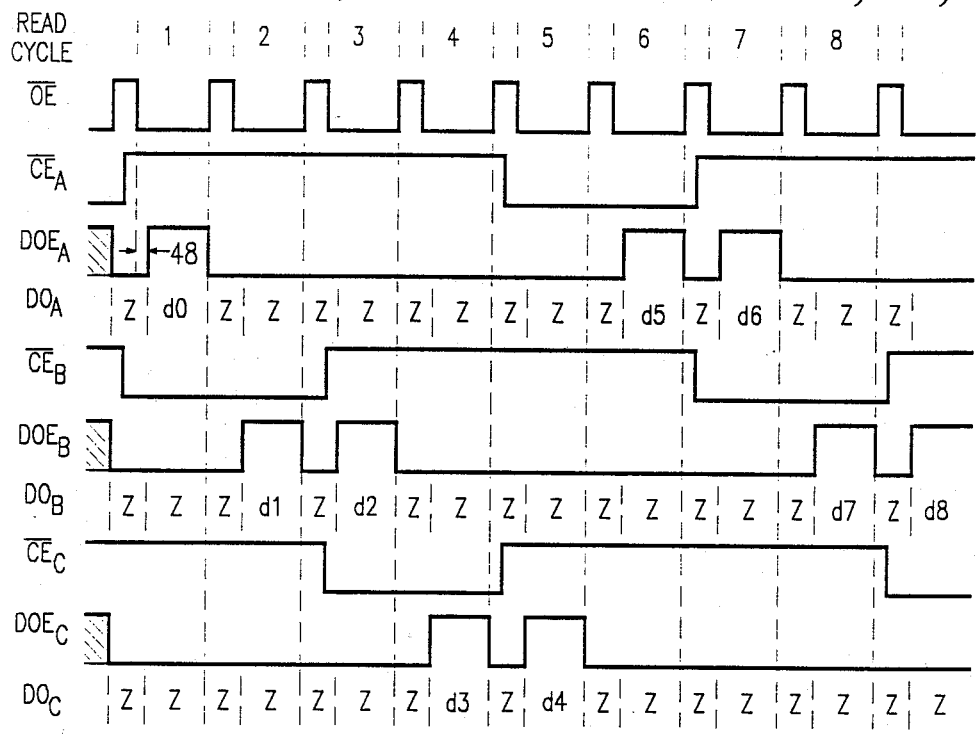
FIG. 3 is a timing diagram showing read cycles for the three memory in FIG. 2.
Figure 4:
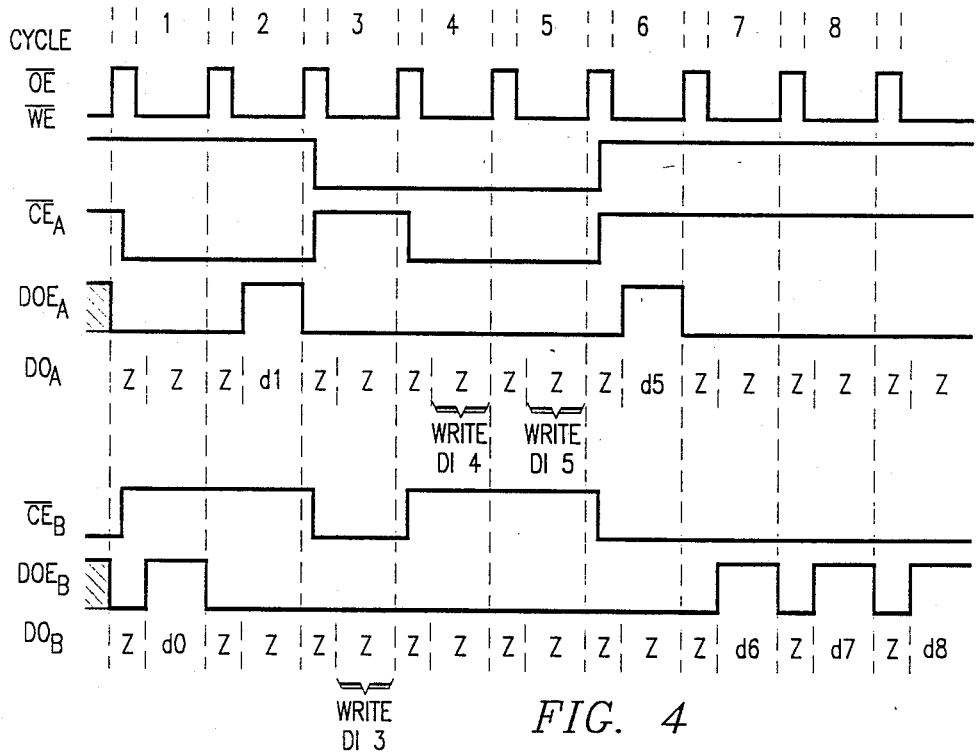
FIG. 4 is a timing diagram showing read and write cycles for two of the memory devices shown in FIG. 2.

As shown in FIG. 3 and FIG. 4, only one of the $\overline{CE}$ signals to the three memory devices is low at one particular time, and thus only one of the memory devices is either reading or writing data during each memory cycle. In the preferred embodiment the $\overline{WE}$, $\overline{CE}$, and address signals change logic states during the time that the $\overline{OE}$ signal is at a logic 1 level.

The registered output circuit 10 of the present invention causes the data from the previous cycle to be available at the output terminal 18 when the next cycle is being read from the memory matrix. For example, as shown in FIG. 3, during the second read cycle the output data of MEMB, shown as DO$_B$, is providing the data, shown as d1, from the previous read operation.

The registered output circuitry of FIG. 2 allows a memory cycle time during a read operation to be equal to the time required to provide valid data at the output of the sense amplifier 12 without the additional time necessary to propagate the data from the output of the sense amplifier 12 to the output terminal of the memory 18 and the time necessary to hold the data at the output terminal 18 to allow external circuitry to detect this logic level at the output terminal 18. For example, in a static RAM with a read access time specification of 35 nanoseconds, the actual cycle time requires 40 nanoseconds between successive read commands to allow the data to be properly read out of the memory. However, the addition of the registered output circuitry of the present invention would allow the memory to be cycled in approximately 30 nanoseconds with the additional approximately 5 nanoseconds required to propagate through the output driver circuit 16 occurring while the next read cycle is beginning. Therefore, the width of the negative $\overline{OE}$ pulse is equal to the time required for the data to arrive at the output of the sense amplifier 12. This rising edge of the $\overline{OE}$ signal is then used to clock the inverse of the $\overline{CE}$ signal into the D latch 28 to determine if the same memory device will be outputting data during the next memory cycle or if the memory device output terminal 18 is to remain in a high impedance state during the next memory cycle.

Thus as shown in FIG. 3, the memory device MEMA is used to provide the data from the previous read cycle or read cycle 0 during the first read cycle, and the memory device MEMB is used to provide the data from the first and second memory cycles during the second and third memory cycles, and the MEMC memory device is used to provide the data from the third and fourth memory cycles during the fourth and fifth memory cycles. Thus, FIG. 3 shows that the three memory devices can be cascaded without creating a contention on the output data terminals 18 during successive read cycles. Although not shown in FIG. 3, it will be understood that the write enable signal, $\overline{WE}$, is at a logic 1 level during the read operations shown in FIG. 3.

The registered output circuitry 10 is not involved in a write operation. Therefore as shown in FIG. 4, when a memory using the registered output circuitry switches from a read operation to a write operation, the data read from the memory matrix during the last read operation is not made available in the subsequent write operation, but rather data is written into the memory in a normal write operation. For example, during the second cycle the MEMA memory device is reading the data recovered from the memory matrix during the first cycle, but between the second and third memory cycle the $\overline{WE}$ signal changes from a logic 1 level to a logic 0 level. Therefore the next operation is a write operation, and the data recovered during the previous read cycle is not available during this write operation. When the memory device switches from a write operation to a read operation and this same memory device is being enabled for both operations, then the first data out of the first read operation will be the same data which was written into the memory during the preceding write operation. This is shown in cycles 5 and 6 in FIG. 4 for the MEMA memory device. This occurs because the SRAM memory device used in the preferred embodiment provides the same data at the output of the sense amplifier 12 as is being written into the memory device.

In the preferred embodiment the memory device is a static random access memory having a lithium battery backup. This SRAM device allows the write operations to be made in the same cycle time as the read operations using the registered output circuitry 10. Also in the preferred embodiment, the registered output circuitry 10 is a laser option selected after the integrated circuit chip has been fabricated to provide the option of either registered outputs or normal outputs as used in conventional SRAMs. While the registered output circuitry in the preferred embodiment is laser selectable, it would be also possible to switch electronically between normal outputs and the registered outputs using either an additional external pin or some other method such as in response to a predetermined data pattern stored in a specific location in the memory.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A method for providing data at an output terminal of a memory device comprising the steps of:
    (a) storing, in a storage device, the output signal of a sense amplifier in said memory device upon a first transition of an output enable signal applied to said memory device;
    (b) receiving a chip enable signal provided externally to said memory device upon a second transition, opposite to said first transition of said output enable signal, and placing a first logic level on an internal node of said memory device if said chip enable signal is within a predetermined voltage range; and (c) enabling an output driver circuit, coupled to said storage device, to drive said output terminal of said memory device in response to data stored in said storage device if said internal node is at said first logic level.

2. The method set forth in claim 1, wherein said step of enabling an output driver circuit occurs at a predetermined time delay after said first transition.

3. Apparatus for providing data at an output terminal of a memory device comprising:
 (a) means for storing data from a sense amplifier in said memory device upon a first transition of an output enable signal externally applied to said memory device;
 (b) means for receiving a chip enable signal provided externally to said memory device, upon a second transition, opposite to said first transition, of said output enable signal, and placing a first logic level on an internal node of said memory device if said chip enable signal is within a predetermined voltage range; and
 (c) means for enabling an output driver circuit, coupled to said means for storing data, drive said output terminal of said memory device in response to data stored in said means for storing if said internal node is at said first logic level.

4. An integrated circuit memory, comprising:
terminals and at least one data terminal address;
at least two but no more than three terminals for incoming control signals, including an output enable signal terminal and a chip-enable signal connection;
an array of memory cells;
address decoding logic, connected to decode incoming address signals which may be received at said address connections and to access a selected one of said memory cells accordingly;
at least one sense amplifier, connected to amplify signals which may be read out from an accessed one of said cells; and
an output driver circuit, operatively connected to amplify the data output of said sense amplifier, and to drive a data output, on at least one of said data connections, accordingly;
wherein, during a read operation, when said output enable signal transitions from a second state to a first state, said output driver circuit;
 ceases to drive said data output,
 and also stores an instantaneous data state in accordance with the instantaneous output of said sense amplifier,
 and also stores the instantaneous state of said chip-enable signal;
and, when said output enable signal transitions from said first state to said second state, said output driver circuit;
 drives said data output in accordance with said stored instantaneous data state, but only if said stored instantaneous state of said chip-enable signal corresponds to a predetermined state.

5. The memory set forth in claim 4, wherein said memory has exactly three of said connections for incoming control signals.

6. The memory set forth in claim 4, wherein said memory has exactly three of said connections for incoming control signals, consisting of said output enable connection, a write-enable signal connection, and said chip-enable signal connection.

7. The memory of claim 4, wherein said output driver circuit includes a buffer stage which is connected to respond to transitions of said output enable signal to said second state with a first delay, and to respond to transitions of said output enable signal to said first state with a second delay which is different from said first delay.

8. The memory of claim 4, wherein said output driver circuit includes a latch which is connected to receive an input corresponding to said data output of said sense amplifier.

9. The memory of claim 4, wherein said output driver circuit includes: a first D latch, which is connected to receive an input corresponding to said data output of said sense amplifier and which is clocked by a signal corresponding to said output enable signal; and a second D latch, which is connected to receive an input corresponding to said chip enable signal and which is clocked by a signal corresponding to said output enable signal.

10. The memory set forth in claim 4, wherein said output driver circuit drives said data output only after a predetermined time delay has elapsed after said transition to said second state.

11. The memory set forth in claim 10, wherein said output driver circuit ceases to drive said data output before said predetermined time delay has elapsed after said transition to said first state.

* * * * *